(12) United States Patent
Chen

(10) Patent No.: US 12,446,453 B2
(45) Date of Patent: Oct. 14, 2025

(54) MANUFACTURING METHOD OF PATTERNED QUANTUM DOT LIGHT-EMITTING LAYER AND MANUFACTURING METHOD OF LIGHT-EMITTING DEVICE

(71) Applicants: Beijing BOE Technology Development Co., Ltd., Beijing (CN); BOE Technology Group Co., Ltd., Beijing (CN)

(72) Inventor: Zhuo Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1134 days.

(21) Appl. No.: 17/356,629

(22) Filed: Jun. 24, 2021

(65) Prior Publication Data
US 2022/0113630 A1    Apr. 14, 2022

(30) Foreign Application Priority Data
Oct. 14, 2020   (CN) .......................... 202011099330.2

(51) Int. Cl.
| | | |
|---|---|---|
| G03F 7/004 | (2006.01) | |
| G03F 7/16 | (2006.01) | |
| G03F 7/32 | (2006.01) | |
| H10K 71/20 | (2023.01) | |
| B82Y 20/00 | (2011.01) | |
| B82Y 30/00 | (2011.01) | |
| H10K 50/115 | (2023.01) | |
| H10K 50/15 | (2023.01) | |
| H10K 50/16 | (2023.01) | |
| H10K 50/17 | (2023.01) | |

(52) U.S. Cl.
CPC ......... *H10K 71/221* (2023.02); *G03F 7/0045* (2013.01); *G03F 7/162* (2013.01); *G03F 7/325* (2013.01); *B82Y 20/00* (2013.01); *B82Y 30/00* (2013.01); *H10K 50/115* (2023.02); *H10K 50/15* (2023.02); *H10K 50/16* (2023.02); *H10K 50/17* (2023.02)

(58) Field of Classification Search
CPC ....... G03F 7/0045; G03F 7/004; G03F 7/0047
See application file for complete search history.

(56) References Cited

U.S. PATENT DOCUMENTS

| | | | | |
|---|---|---|---|---|
| 2004/0247880 | A1* | 12/2004 | Valette | C08G 59/1438 |
| | | | | 528/106 |
| 2005/0221598 | A1 | 10/2005 | Lu et al. | |
| 2005/0277755 | A1 | 12/2005 | Tamada et al. | |
| 2006/0211256 | A1* | 9/2006 | Takei | G03F 7/11 |
| | | | | 430/313 |
| 2011/0171584 | A1 | 7/2011 | Suh et al. | |
| 2013/0196405 | A1* | 8/2013 | Singh | D01D 5/34 |
| | | | | 428/394 |
| 2015/0188097 | A1 | 7/2015 | Khachatryan et al. | |
| 2015/0291417 | A1 | 10/2015 | Yoon et al. | |
| 2017/0256754 | A1* | 9/2017 | Defranco | H10K 50/15 |

FOREIGN PATENT DOCUMENTS

| | | |
|---|---|---|
| CN | 102169959 A | 8/2011 |
| CN | 103531442 A | 1/2014 |

OTHER PUBLICATIONS

Office Action for Chinese Application No. 202011099330.2 issued on Jun. 7, 2023.

* cited by examiner

*Primary Examiner* — Daborah Chacko-Davis
(74) *Attorney, Agent, or Firm* — ArentFox Schiff LLP; Michael Fainberg

(57) ABSTRACT

A manufacturing method of a patterned quantum dot light-emitting layer includes: forming a sacrificial layer on a side of a base substrate, wherein the sacrificial layer includes a first component and a second component mixed in the first component; forming a patterned photoresist layer on a side of the sacrificial layer facing away from the base substrate; etching the sacrificial layer by taking the patterned photoresist layer as a mask to form a patterned sacrificial layer; forming a quantum dot film layer on a side of the photoresist layer facing away from the sacrificial layer; making the second component decompose under the preset condition to produce the bubbles, to make the first component form the porous structure; and forming the patterned quantum dot light-emitting layer by removing the photoresist layer, the sacrificial layer and the quantum dot film layer attached to the sacrificial layer, by dissolution via a solvent.

12 Claims, 4 Drawing Sheets

MANUFACTURING METHOD OF PATTERNED QUANTUM DOT LIGHT-EMITTING LAYER AND MANUFACTURING METHOD OF LIGHT-EMITTING DEVICE

CROSS REFERENCES TO RELATED APPLICATION

This application is based on and claims priority under 35 U.S.C 119 to Chinese Patent Application No. 202011099330.2, filed on Oct. 14, 2020, in the China National Intellectual Property Administration. The entire disclosure of the above application is incorporated herein by reference.

FIELD

The disclosure relates to the technical field of semiconductors, in particular to a manufacturing method of a patterned quantum dot light-emitting layer and a manufacturing method of a light-emitting device.

BACKGROUND

High-resolution active electroluminescent quantum dot display is one of developing directions of quantum dot electroluminescent display. A method for manufacturing high-resolution organic electroluminescent display devices includes removal of SLs (sacrificial layers). However, in the related art, a quantum dot light-emitting layer is prone to being damaged in a removal process, which leads to a problem of low efficiency of quantum dot light-emitting devices.

SUMMARY

The disclosure provides a manufacturing method of a patterned quantum dot light-emitting layer and a manufacturing method of a light-emitting device.

The manufacturing method of the patterned quantum dot light-emitting layer provided by an embodiment of the disclosure includes:
  forming a sacrificial layer on a side of a base substrate, wherein the sacrificial layer includes a first component and a second component mixed in the first component, and the second component decomposes under a preset condition to produce bubbles, to make the first component porous;
  forming a patterned photoresist layer on a side of the sacrificial layer facing away from the base substrate;
  etching the sacrificial layer by taking the patterned photoresist layer as a mask to form a pattern of the sacrificial layer;
  forming a quantum dot film layer on a side of the photoresist layer facing away from the sacrificial layer;
  making the second component decompose under the preset condition to produce the bubbles, to make the first component form the porous structure; and
  forming the patterned quantum dot light-emitting layer by removing the photoresist layer, the sacrificial layer and the quantum dot film layer attached to the sacrificial layer, by dissolution via a solvent.

An embodiment of the disclosure further provides a manufacturing method of a quantum dot light-emitting device, including:
  forming a first electrode on a side of a base substrate; and
  forming a second electrode on a side of the first electrode facing away from the base substrate; wherein
  after forming the first electrode on the side of the base substrate and before forming the second electrode on the side of the first electrode facing away from the base substrate, the manufacturing method further comprises forming a patterned quantum dot light-emitting layer, comprising:
  forming a sacrificial layer on the side of the first electrode facing away from the base substrate, wherein the sacrificial layer comprises a first component and a second component mixed in the first component, and the second component decomposes under a preset condition to produce bubbles, to make the first component porous;
  forming a patterned photoresist layer on a side of the sacrificial layer facing away from the base substrate;
  etching the sacrificial layer by taking the patterned photoresist layer as a mask to form a pattern of the sacrificial layer;
  forming a quantum dot film layer on a side of the photoresist layer facing away from the sacrificial layer;
  making the second component decompose under the preset condition to produce the bubbles, to make the first component form the porous structure; and
  forming the patterned quantum dot light-emitting layer by removing the photoresist layer, the sacrificial layer and the quantum dot film layer attached to the sacrificial layer, by dissolution via a solvent.

DETAILED DESCRIPTION OF THE EMBODIMENTS

Figure 1:
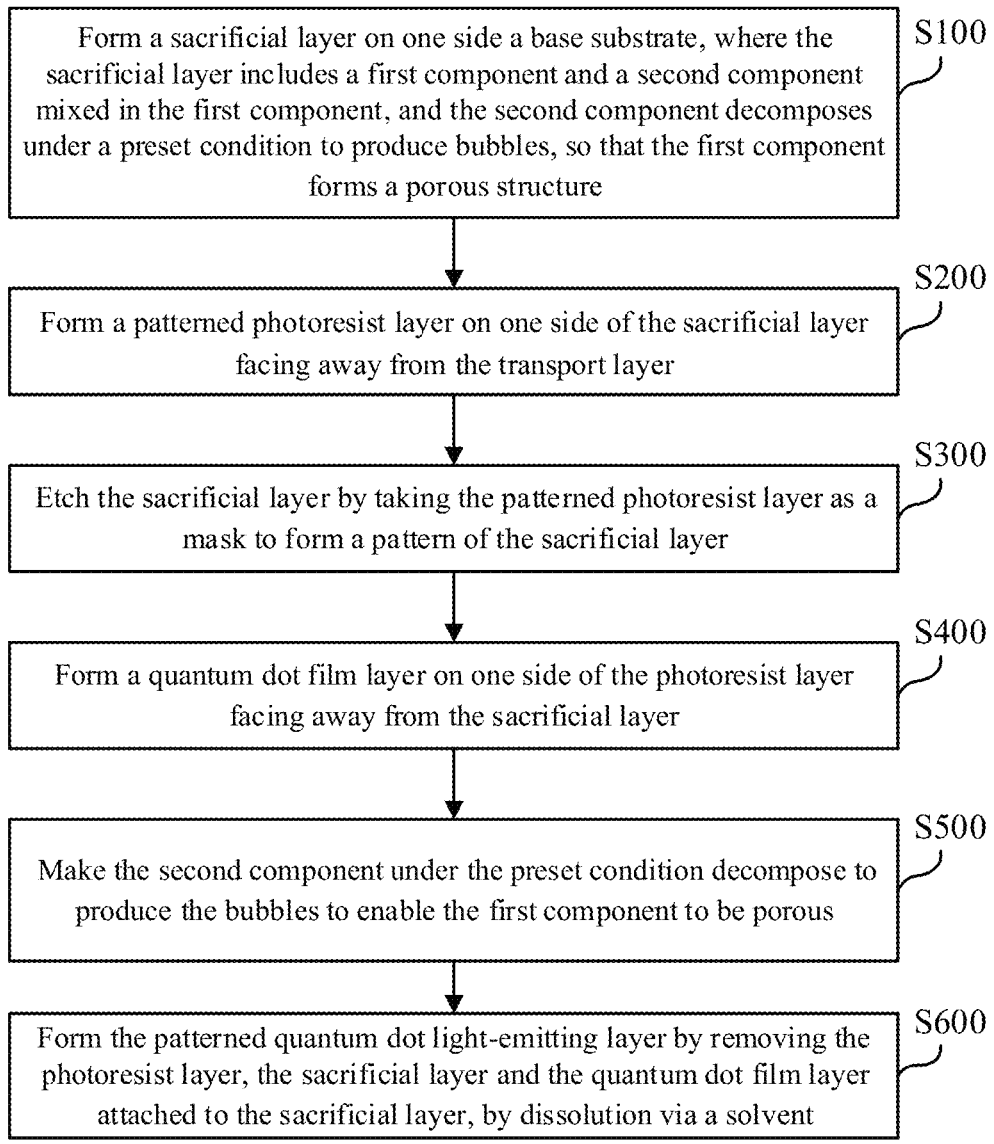
FIG. 1 shows a flowchart of a manufacturing method of a quantum dot light-emitting film layer provided by an embodiment of the disclosure.

In order to enable objectives, technical solutions and advantages of the embodiments of the disclosure clearer, a clear and complete description of the technical solutions of the embodiments of the disclosure will be given below with reference to the accompanying drawings of the embodiments of the disclosure. Obviously, the embodiments described are part of the disclosure and not all of the embodiments. Based on the described embodiments of the disclosure, all other embodiments obtained by those of ordinary skill in the art without creative efforts are covered by the scope of protection of the disclosure.

Unless otherwise defined, technical terms or scientific terms used in this disclosure shall have the ordinary meaning understood by those of ordinary skill in the art to which this disclosure belongs. As used in this disclosure, "first", "second" and similar words do not indicate any order, quantity or importance, but are only used to distinguish different components. Similar words such as "include" or "comprise" mean that the elements or objects appearing before the word cover the listed elements or objects appearing after the word and their equivalents, but do not exclude other elements or objects. Similar words such as "connection" or "coupling" are not limited to physical or mechanical connection, but may include electrical connection, whether direct or indirect. "Upper", "lower", "left" and "right" are only used to express the relative positional relationship. When the absolute position of the described object changes, the relative positional relationship may change accordingly.

In order to keep following descriptions of the embodiments of the disclosure clear and concise, detailed descriptions of known functions and known parts are omitted herein.

The manufacturing method of a patterned quantum dot light-emitting layer provided by an embodiment of the disclosure includes:
  forming a sacrificial layer on a side of a base substrate, where the sacrificial layer includes a first component and a second component mixed in the first component, and the second component decomposes under a preset condition to produce bubbles to make the first component porous;
  forming a patterned photoresist layer on a side of the sacrificial layer facing away from the base substrate;
  etching the sacrificial layer by taking the patterned photoresist layer as a mask to form a pattern of the sacrificial layer;
  forming a quantum dot film layer on a side of the photoresist layer facing away from the sacrificial layer;
  making the second component decompose under the preset condition to produce the bubbles, to allow the first component to be porous; and
  removing, by dissolution via a solvent, the photoresist layer, the sacrificial layer and the quantum dot film layer attached to the sacrificial layer to form the patterned quantum dot light-emitting layer.

In some embodiments, the quantum dot light-emitting layer may be applied to a photoluminescent device. In this case, the quantum dot light-emitting layer may be directly used as a color filter.

In some embodiments, the quantum dot light-emitting layer may be applied to an electroluminescence device. In this case, the quantum dot light-emitting layer is usually disposed between electrodes.

The following is an example that the quantum dot light-emitting layer is applied to the electroluminescence device.

As shown in FIG. 1, the embodiment of the disclosure provides a manufacturing method of a patterned quantum dot light-emitting layer, including:
  S100, forming a sacrificial layer on a transport layer of a base substrate, where the sacrificial layer includes a first component and a second component mixed in the first component, and the second component decomposes under a preset condition to produce bubbles to make the first component porous; and in some embodiments, the thickness of the sacrificial layer may range from 200 nm to 500 nm;
  S200, forming a patterned photoresist layer on a side of the sacrificial layer facing away from the transport layer;
  S300, etching the sacrificial layer by taking the patterned photoresist layer as a mask to form a pattern of the sacrificial layer;
  S400, forming a quantum dot film layer on a side of the photoresist layer facing away from the sacrificial layer;
  S500, making the second component under the preset condition decompose to produce the bubbles to enable the first component to be porous; in some embodiments, the preset condition may be heating, and the step may be specifically as follows: heating the sacrificial layer to make the second component to decompose to produce the bubbles, to enable the first component to be porous; and
  S600, forming the patterned quantum dot light-emitting layer by removing the photoresist layer, the sacrificial layer and the quantum dot film layer attached to the sacrificial layer, by dissolution via a solvent.

In some embodiments, the transport layer is an electron transport layer or a hole transport layer.

In some embodiments, the solvent is an alcohols solvent.

In some embodiments, the alcohols solvent may be ethanol, propanol, isopropyl alcohol, n-butanol or isobutanol.

In the embodiment of the disclosure, a new sacrificial layer material system is provided. The sacrificial layer includes the first component and the second component mixed in the first component, the second component decomposes under the preset condition to produce the bubbles, so that bubbles form in the first component and inflate, a film layer structure of the first component is destroyed to be porous, so that when the sacrificial layer is lifted off and removed, solvent molecules are easy to enter the first component and dissolve the first component. Thus, the sacrificial layer may be lifted off and removed without ultrasound, the quality of a film layer of the quantum dot light-emitting layer is improved, and the efficiency and stability of the quantum dot light-emitting device is improved.

It should be noted that in the conventional process of forming a patterned quantum dot light-emitting layer through a sacrificial layer, ultrasonic assistance is needed when the sacrificial layer is removed subsequently. However, strong vibration in an ultrasonic assisted method is prone to causing destruction of the quantum dot light-emitting film layer and affecting the device efficiency. However, by providing a new sacrificial layer material system in the embodiment of the disclosure, the use of the ultrasonic assistance may be avoided, and therefore the quality of the quantum dot light-emitting film layer is not affected.

In some embodiments, the first component may be made of an alcohol-soluble polymer material, in the subsequent removal, the alcohol-soluble polymer material can be easily removed by the alcohols solvent, which is conducive to simplifying manufacturing steps of the quantum dot light-emitting film layer. In some embodiments, a material of the first component includes polyvinyl alcohol or polyvinylpyrrolidone.

In some embodiments, the second component is made of a small molecular material producing gas through thermal decomposition. In some embodiments, a material of the second component includes one or a combination of the following:

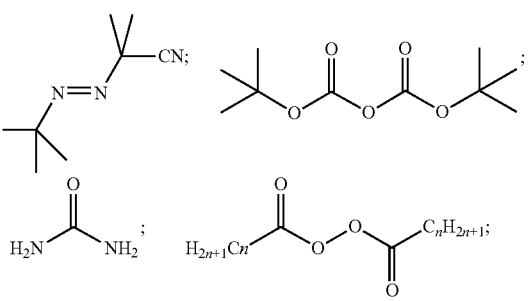

-continued

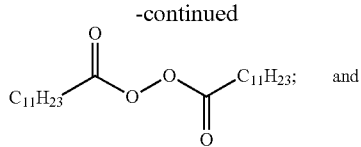

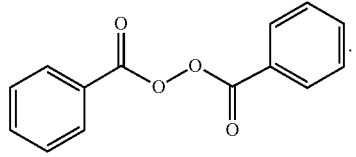

A specific process of step S500 is illustrated as follows when the materials of the second component are different.

In some embodiments, the material of the second component includes

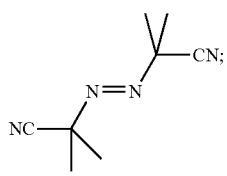

and in S500, making the second component decompose under the preset condition to produce the bubbles includes:
the second component is subjected to a following reaction process:

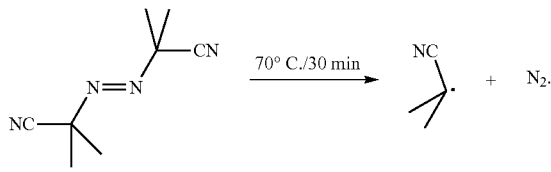

Generated $N_2$ can loosen a dense structure of the first component and facilitate subsequent removal of the first component.

In some embodiments, the material of the second component includes

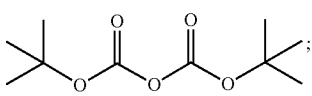

and in S500, making the second component decompose under the preset condition to produce the bubbles includes:
the second component is subjected to a following reaction process:

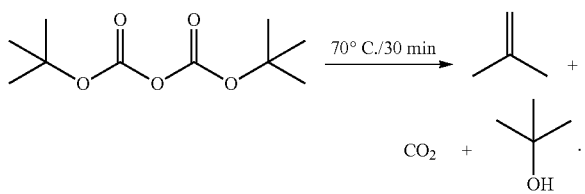

Generated $CO_2$ can loosen the dense structure of the first component and facilitate subsequent removal of the first component.

In some embodiments, the material of the second component includes

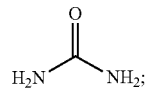

and in S500, making the second component decompose under the preset condition to produce the bubbles includes:
the second component is subjected to a following reaction process:

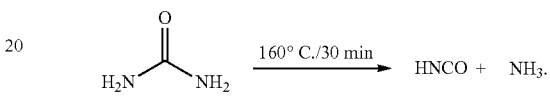

Generated $NH_3$ can loosen the dense structure of the first component and facilitate subsequent removal of the first component.

In some embodiments, for S200, forming the patterned photoresist layer on a side of the sacrificial layer facing away from the base substrate includes: forming a patterned negative photoresist layer on the side of the sacrificial layer facing away from the base substrate. Generally, development includes development of a positive photoresist and development of a negative photoresist. In the development of the positive photoresist, the positive photoresist in an exposure zone is dissolved in a developer solution. In the development of the negative photoresist, the negative photoresist in the exposure zone is dissolved in a developer solution. The developer solution used for the positive photoresist is generally an alkaline aqueous solution, which may cause damage to the quantum dot film layer. In the embodiment of the disclosure, the negative photoresist is used, and a corresponding solvent thereof and the developer solution are generally organic solvents such as xylene, which will not affect a quantum dot material.

Based on the same disclosed concept, an embodiment of the disclosure further provides a manufacturing method of a quantum dot light-emitting device, including:
forming a first electrode on a side of a base substrate; and
forming a second electrode on a side of the first electrode facing away from the base substrate; where
after forming the first electrode on the side of the base substrate and before forming the second electrode on the side of the first electrode facing away from the base substrate, the manufacturing method further includes:
forming a patterned quantum dot light-emitting layer by using the above manufacturing method provided by the embodiment of the disclosure.

In some embodiments, after forming the quantum dot light-emitting layer on the side of the first transport layer facing away from the first electrode and before forming the second electrode, the method further includes:
forming a second transport layer on a side of the quantum dot light-emitting layer facing away from a first transport layer.

Figure 2A:
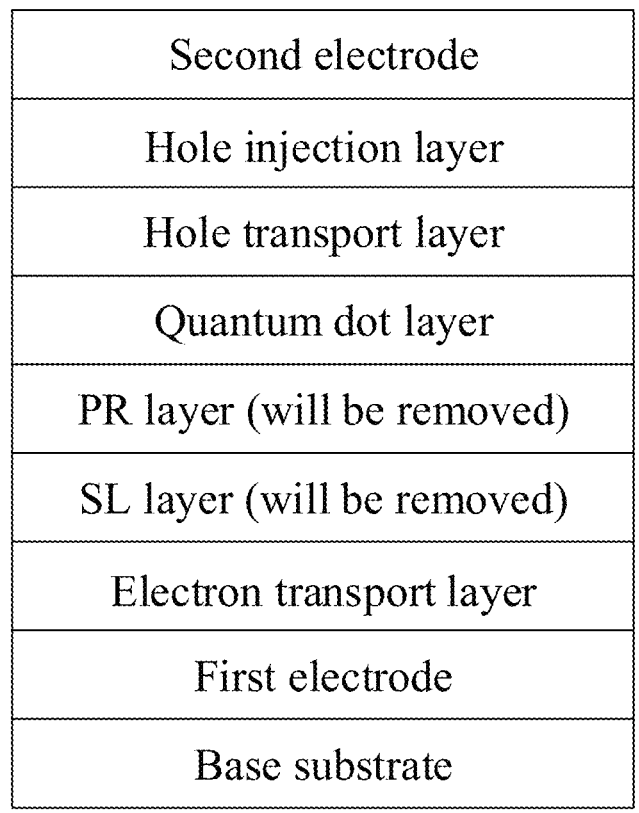
FIG. 2A shows a schematic structural diagram of a quantum dot light-emitting device provided by an embodiment of the disclosure.
Figure 2B:
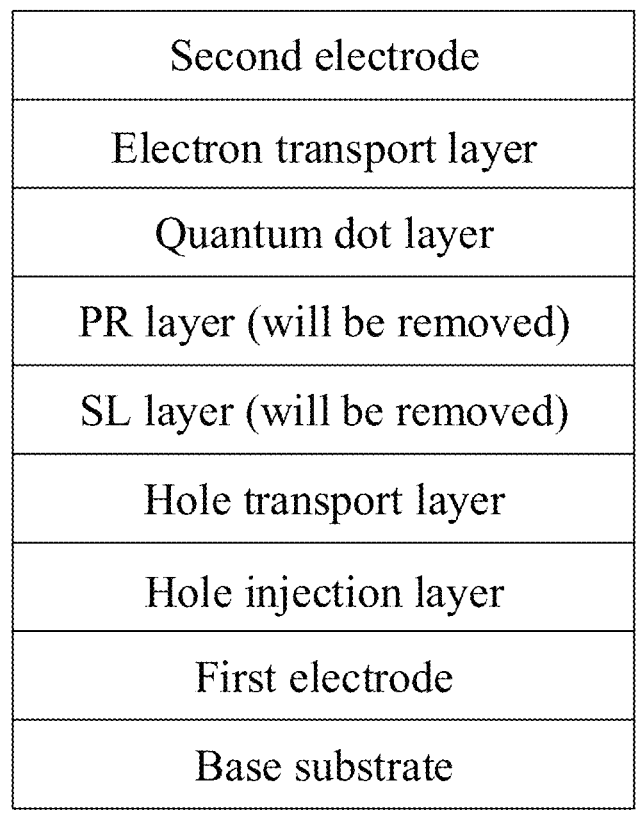
FIG. 2B shows a schematic structural diagram of another quantum dot light-emitting device provided by an embodiment of the disclosure.

In some embodiments, the first transport layer is an electron transport layer, and the second transport layer is a hole transport layer, as shown in FIG. 2A; or the first transport layer is a hole transport layer, and the second transport layer is an electron transport layer, as shown in FIG. 2B.

In some embodiments, when the first transport layer is the electron transport layer, and the second transport layer is the hole transport layer, the manufacturing method of the quantum dot light-emitting device includes:
  forming the first electrode on the base substrate;
  forming the electron transport layer on a side of the first electrode facing away from the base substrate;
  forming a patterned quantum dot layer on a side of the electron transport layer facing away from the base substrate, using the above mothed shown in FIG. 1;
  forming the hole transport layer on a side of the quantum dot layer facing away from the electron transport layer;
  forming a hole injection layer on a side of the hole transport layer facing away from the quantum dot layer; and
  forming the second electrode on a side of the hole injection layer facing away from the hole transport layer.

In some embodiments, when the first transport layer is the hole transport layer, and the second transport layer is the electron transport layer, the manufacturing method of the quantum dot light-emitting device includes:
  forming the first electrode on the base substrate;
  forming the hole injection layer on a side of the first electrode facing away from the base substrate;
  forming the hole transport layer on a side of the hole injection layer facing away from the first electrode;
  forming the patterned quantum dot layer on a side of the hole transport layer facing away from the base substrate, using the above mothed shown in FIG. 1;
  forming the electron transport layer on a side of the quantum dot layer facing away from the hole transport layer; and
  forming the second electrode on a side of the electron transport layer facing away from the hole transport layer.

Figure 3:
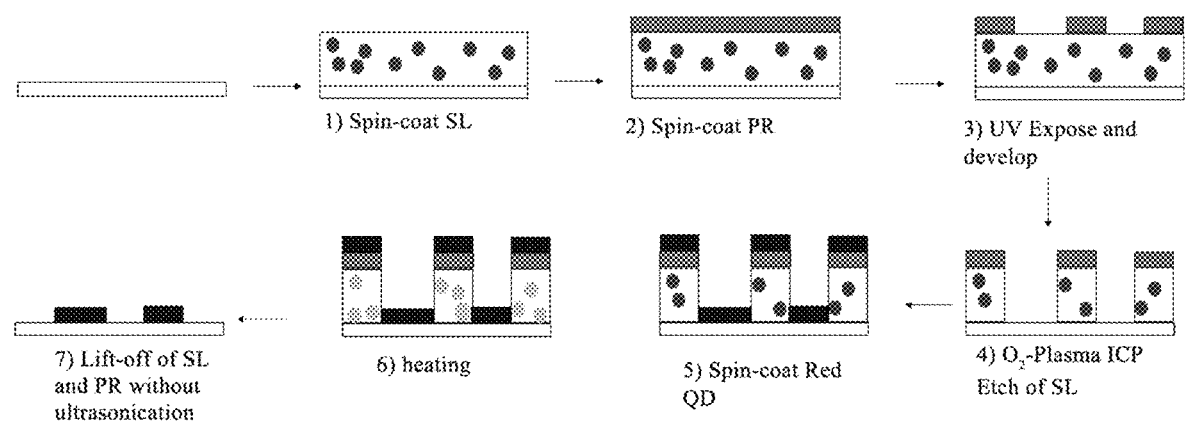
FIG. 3 shows a schematic diagram of a manufacturing process of a quantum dot light-emitting film layer in some embodiments provided by an embodiment of the disclosure.

In some embodiments, FIG. 3 shows another manufacturing method of the patterned quantum dot light-emitting layer. The method includes the following steps.

Step 1, a material of a sacrificial layer (SL) is spin-coated on the transport layer of the base substrate, where the sacrificial layer has two components, the first component may be polyvinyl alcohol, polyvinylpyrrolidone and other alcohol-soluble polymer materials, and the second component is a small molecular material which is capable of producing gas through thermal decomposition.

Step 2, a negative photoresist (PR) is spin-coated.

Step 3, a lithographic mask plate is used for exposure and development so as to form a patterned photoresist layer.

Step 4, the O2-plasma is used to etch the exposed material of the SL (i.e., the material of the SL not shaded by the patterned photoresist), a patterned sacrificial layer is formed, and a part of the transport layer is exposed.

Step 5, a quantum dot film layer is spin-coated on the formed photoresist/sacrificial layer.

Step 6, the small molecular material of the second component in the SL decomposes by heating to produce gas and destroy a dense structure of the polymer.

Step 7, the substrate is immersed in an alcohol solution (ethanol, propanol, isopropyl alcohol, n-butanol, isobutanol, etc.) to remove the negative photoresist and the material of the SL without ultrasound.

In the embodiment of the disclosure, a new sacrificial layer material system is provided. The sacrificial layer includes the first component and the second component mixed in the first component, the second component decomposes under the preset condition to produce the bubbles, so that the bubbles form in the first component and inflate, and a film layer structure of the first component is destroyed and looses to be porous. Thus, when the sacrificial layer is lifted off and removed, solvent molecules are easy to enter the first component and dissolve the first component, so that the sacrificial layer is lifted off and removed without ultrasound, the quality of a film layer of the quantum dot light-emitting layer is improved, and the efficiency and stability of the quantum dot light-emitting device is improved.

It is obvious that those of skill in the art may make various modifications and variations of the disclosure without departing from the spirit and scope of the disclosure. Thus, if such modifications and variations of the disclosure fall within the scope of the claims of the disclosure and their equivalents, the disclosure is also intended to include such modifications and variations.

What is claimed is:

1. A manufacturing method of a patterned quantum dot light-emitting layer, comprising:
  forming a sacrificial layer on a side of a base substrate, wherein the sacrificial layer comprises a first component and a second component mixed in the first component, and the second component decomposes under a preset condition to produce bubbles, to make the first component porous;
  forming a patterned photoresist layer on a side of the sacrificial layer facing away from the base substrate;
  etching the sacrificial layer by taking the patterned photoresist layer as a mask to form a pattern of the sacrificial layer;
  forming a quantum dot film layer on a side of the photoresist layer facing away from the sacrificial layer;
  making the second component decompose under the preset condition to produce the bubbles, to make the first component form the porous structure; and
  forming the patterned quantum dot light-emitting layer by removing the photoresist layer, the sacrificial layer and the quantum dot film layer attached to the sacrificial layer, by dissolution via a solvent;
  wherein a material of the second component comprises one or a combination of following:

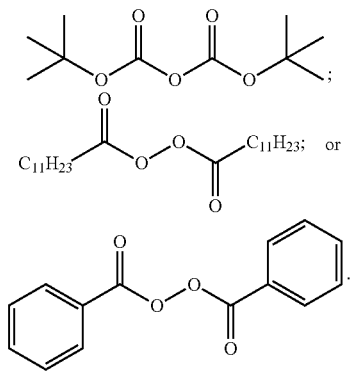

2. The manufacturing method according to claim 1, wherein the first component is made of an alcohol-soluble polymer material.

3. The manufacturing method according to claim 1, wherein making the second component decompose under the preset condition to produce the bubbles comprises:
heating the sacrificial layer to make the second component decompose to produce the bubbles.

4. The manufacturing method according to claim 1, wherein the material of the second component comprises

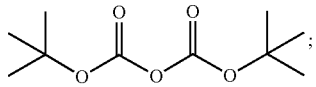

and
making the second component decompose under the preset condition to produce the bubbles comprises:
making the second component be subjected to a following reaction process:

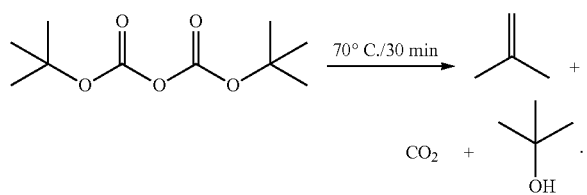

5. The manufacturing method according to claim 1, wherein forming the patterned photoresist layer on the side of the sacrificial layer facing away from the base substrate comprises:
forming a patterned negative photoresist layer on the side of the sacrificial layer facing away from the base substrate.

6. The manufacturing method according to claim 1, wherein the solvent is an alcohols solvent.

7. A manufacturing method of a quantum dot light-emitting device, comprising:
forming a first electrode on a side of a base substrate;
forming the patterned quantum dot light-emitting layer according to claim 1 on a side of the first electrode facing away from the base substrate; and
forming a second electrode on a side of the patterned quantum dot light-emitting layer facing away from the base substrate.

8. The manufacturing method according to claim 7, wherein
before forming the quantum dot light-emitting layer on the side of the first electrode facing away from the base substrate, the method further comprises:
forming a first transport layer on a side of the first electrode facing away from the base substrate to allow the quantum dot light-emitting layer to be formed on a side of the first transport layer facing away from the first electrode; and
after forming the quantum dot light-emitting layer on the side of the first transport layer facing away from the first electrode and before forming the second electrode, the method further comprises:
forming a second transport layer on a side of the quantum dot light-emitting layer facing away from the first transport layer to allow the second electrode to be formed on a side of the second transport layer facing away from the quantum dot light-emitting layer.

9. The manufacturing method according to claim 8, wherein the first transport layer is an electron transport layer, and the second transport layer is a hole transport layer;
wherein after forming the hole transport layer and before forming the second electrode, the manufacturing method further comprises:
forming a hole injection layer on a side of the hole transport layer facing away from the quantum dot layer to allow the second electrode to be formed on a side of the hole injection layer facing away from the hole transport layer.

10. The manufacturing method according to claim 8, wherein the first transport layer is a hole transport layer, and the second transport layer is an electron transport layer;
wherein after forming the first electrode and before forming the hole transport layer, the method further comprises:
forming a hole injection layer on a side of the first electrode facing away from the base substrate to allow the hole transport layer to be formed on a side of the hole injection layer facing away from the first electrode.

11. A manufacturing method of a patterned quantum dot light-emitting layer, comprising:
forming a sacrificial layer on a side of a base substrate, wherein the sacrificial layer comprises a first component and a second component mixed in the first component, and the second component decomposes under a preset condition to produce bubbles, to make the first component porous;
forming a patterned photoresist layer on a side of the sacrificial layer facing away from the base substrate;
etching the sacrificial layer by taking the patterned photoresist layer as a mask to form a pattern of the sacrificial layer;
forming a quantum dot film layer on a side of the photoresist layer facing away from the sacrificial layer;
making the second component decompose under the preset condition to produce the bubbles, to make the first component form the porous structure; and
forming the patterned quantum dot light-emitting layer by removing the photoresist layer, the sacrificial layer and the quantum dot film layer attached to the sacrificial layer, by dissolution via a solvent;
wherein a material of the first component comprises polyvinylpyrrolidone.

12. A manufacturing method of a patterned quantum dot light-emitting layer, comprising:
forming a sacrificial layer on a side of a base substrate, wherein the sacrificial layer comprises a first component and a second component mixed in the first component, and the second component decomposes under a preset condition to produce bubbles, to make the first component porous;
forming a patterned photoresist layer on a side of the sacrificial layer facing away from the base substrate;
etching the sacrificial layer by taking the patterned photoresist layer as a mask to form a pattern of the sacrificial layer;
forming a quantum dot film layer on a side of the photoresist layer facing away from the sacrificial layer;
making the second component decompose under the preset condition to produce the bubbles, to make the first component form the porous structure; and
forming the patterned quantum dot light-emitting layer by removing the photoresist layer, the sacrificial layer and the quantum dot film layer attached to the sacrificial layer, by dissolution via a solvent; wherein the solvent comprises propanol, n-butanol or isobutanol.

* * * * *